(12) United States Patent
Park et al.

(10) Patent No.: US 9,019,013 B2
(45) Date of Patent: Apr. 28, 2015

(54) POWER AMPLIFIER USING DIFFERENTIAL STRUCTURE

(75) Inventors: Jong Hoon Park, Incheon (KR); Chang Kun Park, Gyeonggi-do (KR)

(73) Assignee: Soongsil University Research Consortium Techno-Park, Seoul (KR)

( * ) Notice: Subject to any disclaimer, the term of this patent is extended or adjusted under 35 U.S.C. 154(b) by 0 days.

(21) Appl. No.: 14/008,573

(22) PCT Filed: Oct. 13, 2011

(86) PCT No.: PCT/KR2011/007600
§ 371 (c)(1),
(2), (4) Date: May 9, 2014

(87) PCT Pub. No.: WO2012/134008
PCT Pub. Date: Oct. 4, 2012

(65) Prior Publication Data
US 2014/0232462 A1   Aug. 21, 2014

(30) Foreign Application Priority Data

Mar. 28, 2011 (KR) .................. 10-2011-0027508

(51) Int. Cl.
*H03F 3/45* (2006.01)
*H03F 3/21* (2006.01)

(52) U.S. Cl.
CPC ........ *H03F 3/45179* (2013.01); *H03F 3/45183* (2013.01); *H03F 2203/45318* (2013.01); *H03F 2203/45352* (2013.01); *H03F 2203/45481* (2013.01); *H03F 3/21* (2013.01); *H03F 2003/45008* (2013.01); *H03F 2203/45034* (2013.01); *H03F 2203/45638* (2013.01)

(58) Field of Classification Search
CPC ........................................... H03F 3/45
USPC ................... 330/252, 253, 254, 261
See application file for complete search history.

(56) References Cited

U.S. PATENT DOCUMENTS

| | | | | |
|---|---|---|---|---|
| 5,371,475 A | * | 12/1994 | Brown | 330/254 |
| 6,448,847 B1 | * | 9/2002 | Paul et al. | 327/563 |
| 7,697,915 B2 | * | 4/2010 | Behzad et al. | 455/311 |
| 8,149,064 B2 | | 4/2012 | Dupuis et al. | |
| 8,212,616 B2 | * | 7/2012 | Ohannaidh | 330/261 |

FOREIGN PATENT DOCUMENTS

KR   10-0887427 B1   3/2009

OTHER PUBLICATIONS

K. C. T. et al. "A 1.9-GHz, I-W CMOS Class-E Power Amplifier for Wireless Communications", In: IEEE Journal of Solid-State Circuits, vol. 34, No. 7, Jul. 1999, pp. 962-970.

(Continued)

*Primary Examiner* — Henry Choe
(74) *Attorney, Agent, or Firm* — Revolution IP, PLLC

(57) ABSTRACT

Provided is a power amplifier which includes: a first transistor and a second transistor each having a first end connected to a first power source supplying a first voltage and to which signals having a same size but opposite polarities are input; a third transistor and a fourth transistor having first ends respectively connected to the first ends of the first transistor and the second transistor; and a fifth transistor having a first end connected to second ends of the third and fourth transistors and controlling oscillation of the third or fourth transistor.

6 Claims, 4 Drawing Sheets

(56) References Cited

OTHER PUBLICATIONS

T. T. H. et al. "Class-E CMOS power amplifiers for RF applications", In: Proceedings of the 2003 'International Symposium on Circuits and Systems, May 25-28, 2003, pp. "I-449"-"I-452".

D. H. L. et al. "A Load-Shared CMOS Power Amplifier With Efficiency Boosting at Low Power Mode for Polar Transmitters", In: IEEE Transactions on Microwave Theory and Techn1ques, vol. 56, No. 7, July 2008, pp. 1565-1574.

* cited by examiner

POWER AMPLIFIER USING DIFFERENTIAL STRUCTURE

CROSS REFERENCE TO PRIOR APPLICATIONS

This application is a National Stage Application of PCT International Patent Application No. PCT/KR2011/007600 filed on Oct. 13, 2011, under 35 U.S.C. §371, which claims priority to Korean Patent Application No. 10-2011-0027508 filed on Mar. 28, 2011, which are all hereby incorporated by reference in their entirety.

TECHNICAL FIELD

The present invention relates to a power amplifier using a differential structure, and more particularly, to a power amplifier using a differential structure, wherein a size of a transistor for preventing oscillation is decreased.

BACKGROUND ART

A power amplifier that is one of circuits commonly used in a high frequency integrated circuit (IC) for a wireless communication system is used to increase power of an applied signal. In detail, since signals having a same size and opposite polarities are applied to left and right ends of a basic transistor, and a difference between the signals is amplified by a power amplifier having a differential structure, the power amplifier is strong against noise in a semiconductor substrate, and power may be doubled by using the both ends of the basic transistor. However, when many transistors are connected for high output power, driving power for driving the many transistors is required.

FIGS. 1A and 1B are circuit diagrams of general power amplifiers using a differential structure. The general power amplifier of FIG. 1A is used to further effectively amplify output power, and includes transistors (hereinafter, referred to as basic transistors) 10 and 20 included in a power amplifier structure and additionally includes transistors (hereinafter, referred to as assistant transistors) 30 and 40 for assisting amplification of the basic transistors 10 and 20. The basic transistors 10 and 20 and the assistant transistors 30 and 40 share drains and sources, and gates of the assistant transistors 30 and 40 are connected to output ports 50 and 60 on the opposite side.

In the general power amplifier of FIG. 1A, since the assistant transistors 30 and 40 assist amplification, even when the basic transistors 10 and 20 have small sizes, higher power may be output, and required driving power may be decreased. However, the assistant transistors 30 and 40 operate according to power voltage Vs when a signal is not applied, and thus oscillation may be generated.

The general power amplifier of FIG. 1B is suggested to solve problems of the general power amplifier of FIG. 1A. The general power amplifier of FIG. 1B includes a transistor (hereinafter, referred to as a switch transistor) 70 for controlling oscillation and a switch transistor 80 having an opposite characteristic from the switch transistor 70 in addition to the components of the general amplifier of FIG. 1A. Here, a drain of the switch transistor 70 is connected to the sources of the basic transistors 10 and 20 and the sources of the assistant transistors 30 and 40, and a source of the switch transistor 70 is connected to a ground power source. Also, a source of the switch transistor 80 is connected to a power source 25 outputting a voltage having the same size as the power voltage Vs, and gates of the switch transistors 70 and 80 are connected to each other and applied with a signal for controlling oscillation.

In the general power amplifier of FIG. 1B, when a control signal applied to the switch transistor 70 is in a low level, the switch transistor 70 is unable to operate and thus a connection between a power amplifying stage and the ground power source is disconnected, whereas the switch transistor 80 is operated and thus a power amplifying stage and the power source 25 is connected. Also, since voltages of a power source 15 and the power source 25 are the same, a current cannot flow and thus oscillation of the assistant transistor 40 is blocked. On the other hand, when a control signal applied to the switch transistor is in a high level, the switch transistor 70 is operated and thus the power amplifying stage and the ground power source are connected, and the power amplifying stage may perform amplification. However, the switch transistor 70 has to bear all currents flowing through the basic transistors 10 and 20 and the assistant transistors 30 and 40, and a size of the switch transistor 70 has to be very big in order to prevent an amplification factor from decreasing.

DETAILED DESCRIPTION OF THE INVENTION

Technical Problem

The present invention provides a power amplifier using a differential structure, wherein a size of a transistor for preventing oscillation may be decreased.

Technical Solution

According to an aspect of the present invention, there is provided a power amplifier using a differential structure, the power amplifier including: a first transistor and a second transistor each having a first end connected to a first power source supplying a first voltage and to which signals having a same size but opposite polarities are input; a third transistor and a fourth transistor having first ends respectively connected to the first ends of the first transistor and the second transistor; and a fifth transistor having a first end connected to second ends of the third and fourth transistors and controlling oscillation of the third or fourth transistor.

The first and second transistors may amplify a difference between the input signals, and the third and fourth transistors may assist the amplification by the first and second transistors.

Second ends of the first, second, and fifth transistors may be connected to a second power source supplying a second voltage lower than the first voltage.

When the first and second transistors are turned off, the fifth transistor may be turned off.

The power amplifier may further include a sixth transistor whose first end is connected to the second ends of the third and fourth transistors, second end is connected to the first power source, and a third end connected to a third end of the fifth transistor.

When the first and second transistors are turned off, the fifth transistor may be turned off and the sixth transistor may be turned on.

The fifth and sixth transistors may have different polarities.

A third end of the third transistor may be connected to the first end of the second transistor, and a third end of the fourth transistor may be connected to the first end of the first transistor.

The power amplifier may further include: a first inductor connected between the first power source and the first transistor; a second inductor connected between the first power source and the second transistor; a first output port connected between the first inductor and the first end of the first transistor; and a second output port connected between the second inductor and the first end of the second transistor.

Advantageous Effects

According to a power amplifier using a differential structure of the present invention, driving power required at a power amplifying stage may be reduced or output power may be increased by using an assistant transistor. In addition, by connecting a switch transistor for controlling oscillation only to the assistant transistor causing the oscillation, the switch transistor may be realized in a small size, and a manufacturing cost may be reduced accordingly.

MODE OF THE INVENTION

Figure 1A:
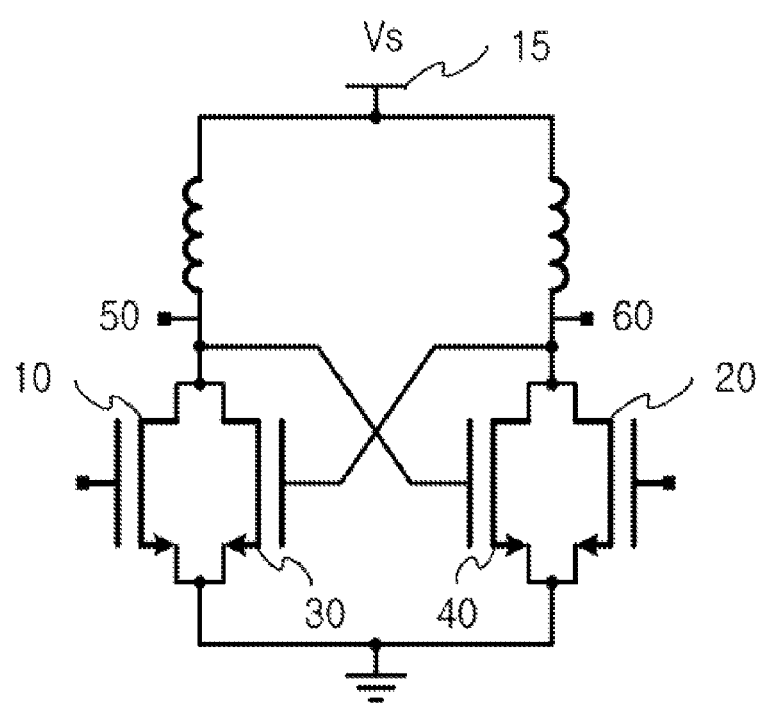
FIGS. 1A and 1B are circuit diagrams of general power amplifiers using a differential structure.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, elements not related to the present invention are not shown and like reference numerals denote like elements.

Herein, when an element is "connected" to another element, the element may be "directly connected" to the other element or may be "electrically connected" through an intermediate element. When a unit "includes" components, the unit may further include other components unless described otherwise.

Also, herein, the expression that a voltage is maintained includes a case in which a potential difference between certain two points changes according to time, if the change is within a range allowed according to designs or is caused by a parasitic component generally ignored by one of ordinary skill in the art. Also, since a threshold voltage of a semiconductor device (a transistor or a diode) is very low compared to a discharge voltage, the threshold voltage is considered to be 0 V and is approximated.

Figure 2:
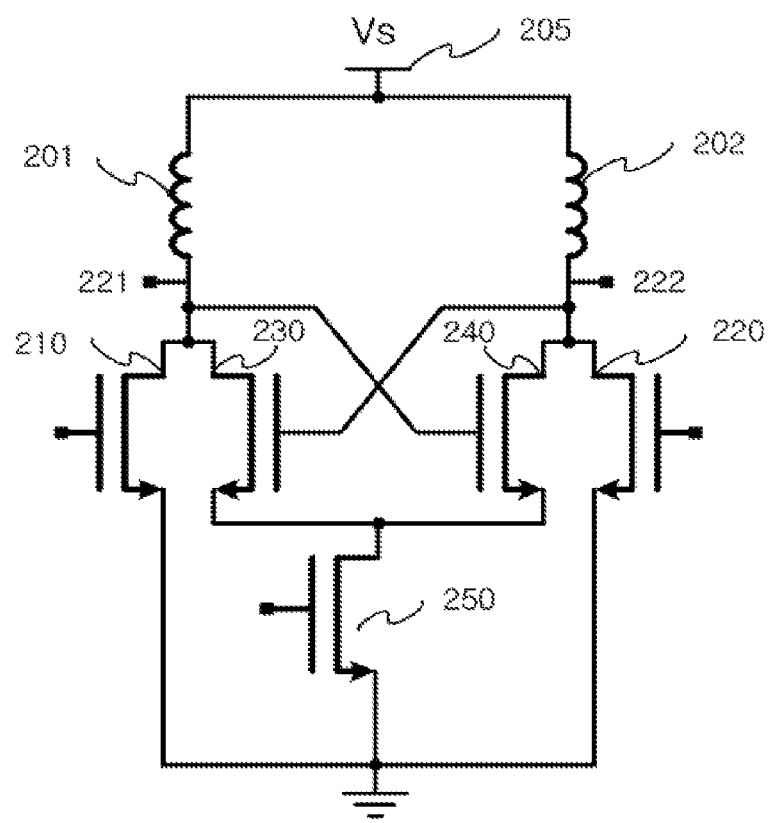
FIG. 2 is a circuit diagram of a power amplifier using a differential structure, according to an embodiment of the present invention.

FIG. 2 is a circuit diagram of a power amplifier using a differential structure, according to an embodiment of the present invention. The power amplifier of FIG. 2 includes inductors 201 and 202, and transistors 210, 220, 230, 240, and 250. The power amplifier according to an embodiment of the present invention amplifies a voltage difference between two input signals applied to two ends of each of the transistors 210 and 220.

Signals having the same size but opposite polarities are respectively applied to the transistors 210 and 220 corresponding to basic transistors, and the transistors 210 and 220 amplify a voltage output according to a difference between the signals. The transistors 230 and 240 corresponding to assistant transistors assist amplification on an output of the power amplifier of FIG. 2. The transistor 250 corresponding to a switch transistor prevents oscillation of the power amplifier of FIG. 2 by controlling operations of the transistors 230 and 240.

In FIG. 2, the transistors 210 through 250 are n-channel field-effect transistors, in detail, n-channel metal oxide semiconductor (NMOS) transistors, and may each include a body diode in a direction from a source to a drain.

Other transistors having similar functions as NMOS transistors may be used as the transistors 210 through 250. Also in FIG. 2, the transistors 210 through 250 are each one transistor, but alternatively, may be each a plurality of transistors connected in parallel.

A connection relationship of the power amplifier of FIG. 2 according to the current embodiment will now be described in detail.

As shown in FIG. 2, first ends of the inductors 201 and 202 are connected to a power source 205 supplying a power voltage Vs of the power amplifier. Also, a second end of the inductor 201 is connected to drains of the transistors 210 and 230, and a second end of the inductor 202 is connected to drains of the transistors 220 and 240. Here, output ports 221 and 222 outputting an output voltage of the power amplifier are provided respectively between the second end of the inductor 201 and the drain of the transistor 210 and between the second end of the inductor 202 and the drain of the transistor 220.

Sources of the transistors 210 and 220 are connected to a ground power source, and signals for controlling on/off operations of the transistors 210 and 220 are input to gates of the transistors 210 and 220. Here, according to characteristics of the power amplifier, signals having opposite polarities are input to the gates of the transistors 210 and 220 corresponding to basic transistors, and thus the on/off operations of the transistors 210 and 220 are opposite to each other.

A gate of the transistor 230 is connected to the output port 222, and a gate of the transistor 240 is connected to the output port 221. Also, sources of the transistors 230 and 240 are connected to a drain of the transistor 250, and a source of the transistor 250 is connected to the ground power source. Also, a control signal for controlling oscillation of the power amplifier is input to a gate of the transistor 250.

Operations of the power amplifier according to the current embodiment will now be described. Since opposite signals are applied to the transistors 210 and 230 and the transistors 220 and 240, when the transistors 210 and 230 are turned on, the transistors 220 and 240 are turned off, and vice versa. Also, when one of the transistors 210 and 220 is turned on, a high level signal is input to the transistor 250 and thus the transistor 250 maintains an on-state.

For convenience of description, it is assumed that the transistor 210 is turned off when the transistors 210 and 230 are turned on and the transistors 220 and 240 are turned off. At this time, since the transistor 230 maintains an on-state, a current is transmitted from the power source 205 to the transistor 230, and thus an oscillation phenomenon wherein the transistor 230 is operated may be generated. An oscillation phenomenon is a phenomenon wherein a signal is unintentionally output even when there is no input signal. According to an embodiment of the present invention, oscillation by the transistor 230 may be prevented by using the transistor 250.

In other words, according to the current embodiment, when the transistor 210 is turned off as described above, since the transistors 210 and 220 are both turned off, a low level signal for turning off the transistor 250 is input to the gate of the transistor 250. Accordingly, when the transistor 250 is turned off, a connection between the transistor 230 and the ground power source is blocked, and thus the transistor 230 is not operated, thereby preventing the power amplifier from oscillating.

When the transistor 220 is turned off while the transistors 210 and 230 are turned off and the transistors 220 and 240 are turned on, the transistor 250 is turned off and thus a connection between the transistor 240 and the ground power source is blocked, thereby preventing the power amplifier from oscillating.

As described above, according to the current embodiment, by connecting the transistors 230 and 240 to the transistor 250 for controlling the oscillation, the transistor 230 or 240 does not generate oscillation even when the transistors 210 and 220 are both turned off. As such, according to the current embodiment, since the transistor 250 prevents the oscillation by the transistors 230 and 240, a power loss caused by the oscillation may be prevented.

Figure 1B:
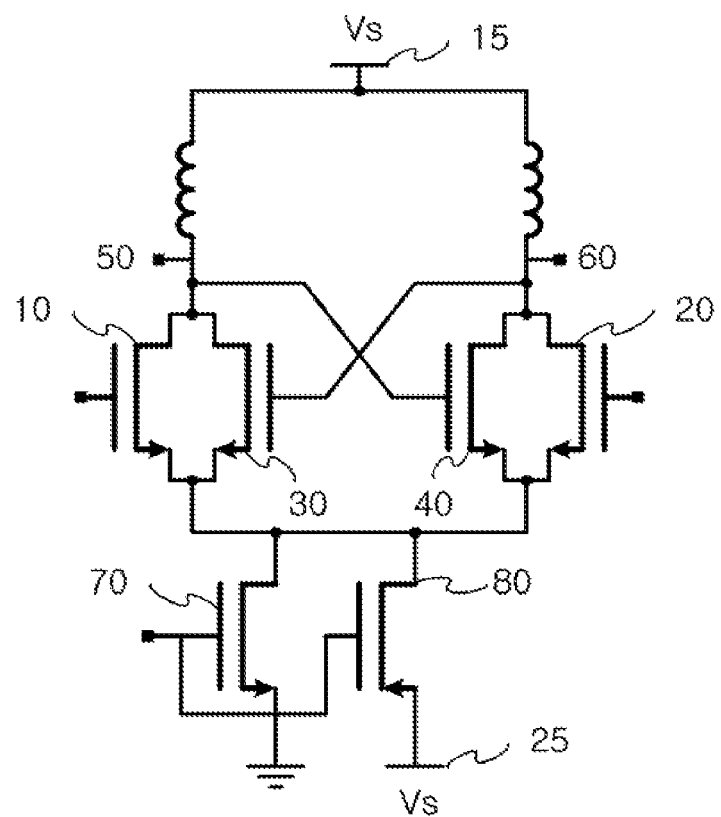

Also, according to the current embodiment of the present invention, the transistor 250 is connected only to the transistors 230 and 240, and not to the transistors 210 and 220. Accordingly, the transistor 250 only has to bear currents flowing through the transistors 230 and 240 during an operation of the power amplifier according to the current embodiment. Thus, the power amplifier according to the current embodiment is economical compared the general power amplifier of FIG. 1B, since a size of the transistor 250 may be reduced by at least 50%.

Figure 3:
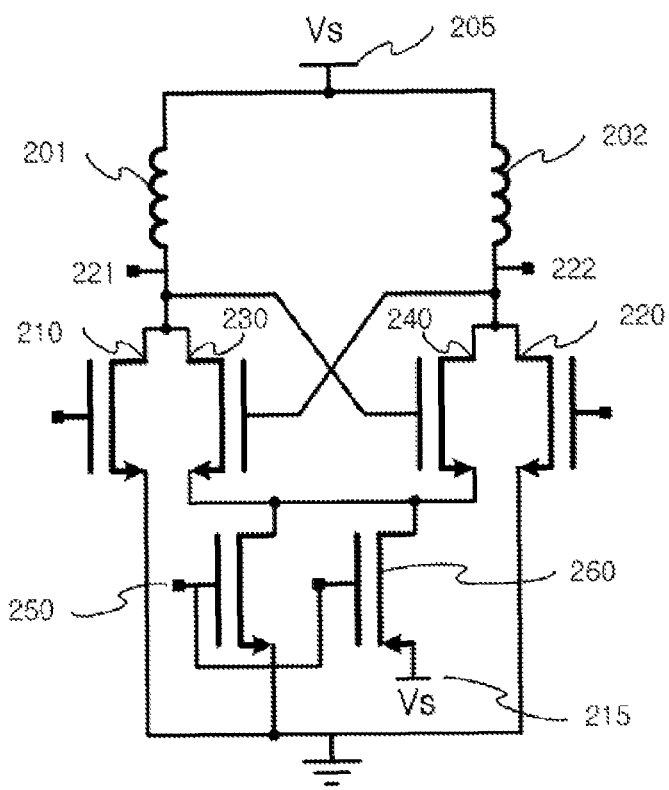
FIG. 3 is a circuit diagram of a power amplifier using a differential structure, according to another embodiment of the present invention.

FIG. 3 is a circuit diagram of a power amplifier using a differential structure, according to another embodiment of the present invention. The power amplifier according to the current embodiment shown in FIG. 3 includes inductors 201 and 202, and transistors 210, 220, 230, 240, 250, and 260. Compared to the power amplifier of FIG. 2, the power amplifier of FIG. 3 further includes the transistor 260, and since like reference numerals denote like elements, overlapping descriptions are omitted and only differences between the power amplifiers of FIGS. 2 and 3 are mainly described.

First, a gate of the transistor 260 is connected to the gate of the transistor 250, and the same signal controlling oscillation is input to the transistors 250 and 260. The transistor 260 has an opposite polarity to the transistor 250, and since the transistor 250 is an NMOS transistor, the transistor 260 is a p-channel metal oxide semiconductor (PMOS) transistor. As shown in FIG. 3, since the gates of the transistors 250 and 260 are connected to each other, the transistors 250 and 260 perform opposite operations according to one input signal.

Also, the drain of the transistor 250 and a drain of the transistor 260 are both connected to the transistors 230 and 240. In other words, the sources of the transistors 230 and 240 are connected to each other via a wire, and a point of the wire is connected to the drain of the transistor 250 and another point of the wire is connected to the drain of the transistor 260. The source of the transistor 250 is connected to the ground power source, whereas the source of the transistor 260 is connected to a power source 215 having a voltage that is same as the power voltage Vs.

Operations of the power amplifier according to the current embodiment will now be described.

As described above, when one of the transistors 210 and 220 is turned on, the transistor 250 maintains an on-state and the transistor 260 is turned off since the transistors 250 and 260 operate opposite to each other.

Like the previous embodiment, for convenience of description, it is assumed that the transistor 210 is turned off when the transistors 210 and 230 are turned on and the transistors 220 and 240 are turned off. According to the current embodiment, when the transistor 210 is turned off, the transistors 210 and 220 are both turned off, and thus a low level signal is input to the gate of the transistor 250. Accordingly, the transistor 250 is turned off and the transistor 260 is turned on.

When the transistor 250 is turned off and the transistor 260 is turned on, the power voltage Vs is caught at the two ends of the transistor 230, and thus a voltage drop is not generated. Accordingly, the transistor 230 is unable to operate, and the power amplifier is prevented from oscillating.

On the other hand, when the transistor 220 is turned off while the transistors 210 and 230 are turned off and the transistors 220 and 240 are turned on, the transistor 250 is turned off and the transistor 260 is turned on. Here, since the power voltage Vs is caught at the two ends of the transistor 240, the transistor 230 is unable to operate, and the power amplifier is prevented from oscillating.

As described above, by using the transistors 230 and 240 that are assistant transistors in the power amplifier, a required driving power of a power amplifying stage may be reduced or a high output may be output.

Also, by connecting the transistors 250 and 260 for controlling the oscillation only to the transistors 230 and 240 causing the oscillation, the transistors 250 and 260 may have a small size. Accordingly, a manufacturing cost may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

DESCRIPTION OF REFERENCE NUMERALS 10, 20, 210, 220: Basic Transistor
30, 40, 230, 240: Assistant Transistor
70, 80, 250, 260: Switch Transistor
50, 60, 221, 222: Output Port
201, 202: Inductor
205, 215: Power Source

The invention claimed is:

1. A power amplifier using a differential structure, the power amplifier comprising:
a first transistor and a second transistor each having a first end connected to a first power source supplying a first voltage and to which signals having a same size but opposite polarities are input;
a third transistor and a fourth transistor having first ends respectively connected to the first ends of the first transistor and the second transistor;
a fifth transistor, having a first end connected to second ends of the third and fourth transistors, configured to control oscillation of the third or fourth transistor, wherein the first and second transistors are configured to amplify a difference between input signals, and the third and fourth transistors are configured to assist the amplification by the first and second transistors, and wherein second ends of the first, second, and fifth transistors are connected to a second power source supplying a second voltage lower than the first voltage; and
a sixth transistor whose first end being connected to the second ends of the third and fourth transistors, a second end of the sixth transistor connected to the first power source, and a third end connected to a third end of the fifth transistor.

2. The power amplifier of claim 1, wherein, when the first and second transistors are turned off, the fifth transistor is turned off.

3. The power amplifier of claim 1, wherein, when the first and second transistors are turned off, the fifth transistor is turned off and the sixth transistor is turned on.

4. The power amplifier of claim 3, wherein the fifth and sixth transistors have different polarities.

5. The power amplifier of claim 1, wherein a third end of the third transistor is connected to the first end of the second transistor, and a third end of the fourth transistor is connected to the first end of the first transistor.

6. The power amplifier of claim 1, further comprising:
- a first inductor connected between the first power source and the first transistor;
- a second inductor connected between the first power source and the second transistor;
- a first output port connected between the first inductor and the first end of the first transistor; and
- a second output port connected between the second inductor and the first end of the second transistor.

* * * * *